United States Patent
Stoler (10) Patent No.: US 10,489,546 B1
(45) Date of Patent: Nov. 26, 2019

(54) MODULAR SYSTEM ON CHIP CONFIGURATION SYSTEM

(71) Applicant: Amazon Technologies, Inc., Seattle, WA (US)

(72) Inventor: Gil Stoler, Nofit (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/024,359

(22) Filed: Jun. 29, 2018

Related U.S. Application Data (62) Division of application No. 14/928,919, filed on Oct. 30, 2015, now Pat. No. 10,019,546.

(51) Int. Cl.
  *G06F 17/50* (2006.01)

(52) U.S. Cl.
  CPC .............................. *G06F 17/5068* (2013.01)

(58) Field of Classification Search
  CPC ............. G06F 17/5027; G06F 17/5045; G06F 12/0284; G06F 12/0692; G06F 17/5022; G06F 9/3802; G06F 9/3824; G06F 12/1081; G06F 13/1684; G06F 13/4282; G06F 13/28; G06F 13/36; G06F 13/4027; G06F 13/404; G06F 2213/0026; G06F 2213/0038; G06F 9/3877; G06F 9/3881; G06F 9/3893; G06F 9/3897
  USPC ........................................ 716/126, 137, 138
  See application file for complete search history.

(56) References Cited

U.S. PATENT DOCUMENTS

| | | | |
|---|---|---|---|
| 5,671,371 A | | 9/1997 | Kondo et al. |
| 5,892,928 A | * | 4/1999 | Wallach ..................... G06F 1/20 710/302 |
| 6,594,712 B1 | * | 7/2003 | Pettey ..................... G06F 13/28 709/212 |
| 2002/0144001 A1 | * | 10/2002 | Collins ............... G06F 12/1081 709/250 |
| 2006/0282233 A1 | | 12/2006 | Pasricha et al. |
| 2016/0183031 A1 | | 6/2016 | Ranganathan |

(Continued)

OTHER PUBLICATIONS

U.S. Appl. No. 14/928,919, "Modular System on Chip Configuration System", filed Oct. 30, 2015.

(Continued)

*Primary Examiner* — Nghia M Doan
(74) *Attorney, Agent, or Firm* — Kilpatrick Townsend & Stockton LLP (57) ABSTRACT

A system-on-a-chip (SoC) includes a master module and a first adapter module. The master module includes an upstream interface and a downstream interface. The upstream interface is coupled to a host unit for receiving a write burst or a read burst therefrom. The master module is configured to convert the write burst or the read burst into a series of access requests to the downstream interface. The first adapter module includes an input interface, an output interface, and an endpoint interface, and an address Base Address Register (BAR). The input interface is coupled to the downstream interface of the master module. The output interface is coupled to a second adapter module or to a termination module. The endpoint interface is coupled to a first functional unit or to a third adapter module. The first adapter module is configured to detect a respective access request corresponding to the address BAR.

21 Claims, 7 Drawing Sheets

(56) References Cited

U.S. PATENT DOCUMENTS

2016/0283428 A1    9/2016  Guddeti

OTHER PUBLICATIONS

U.S. Appl. No. 14/928,919 , "Non-Final Office Action", dated May 17, 2017, 11 pages.
U.S. Appl. No. 14/928,919 , "Notice of Allowance", dated Mar. 21, 2018, 9 pages.
U.S. Appl. No. 14/928,919 , "Restriction Requirement", dated Oct. 16, 2017, 7 pages.

* cited by examiner

MODULAR SYSTEM ON CHIP CONFIGURATION SYSTEM

CROSS REFERENCED TO RELATED APPLICATIONS

This Application is a Divisional of U.S. application Ser. No. 14/928,919, filed Oct. 30, 2015, titled "MODULAR SYSTEM ON CHIP CONFIGURATION SYSTEM", and issued as U.S. Pat. No. 10,019,546 on Jul. 10, 2018, the contents of which are herein incorporated in its entirety.

BACKGROUND

A system-on-a-chip (SoC) is an integrated circuit (IC) that integrates many or all components of a computer or other electronic system into a single chip. A typical SoC comprises many functional units, which may include microprocessors, memory blocks, timing sources, peripherals such as counter-timers, and external interfaces such as Universal Serial Bus (USB) port and an Ethernet port. Each functional unit requires configuration access and debug access in order to enable its operation. During various phases of a design cycle, different functional units may be added, dropped, or relocated. As a consequence, the configuration scheme can become complicated and delicate, and often requires the involvement of the entire design team.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
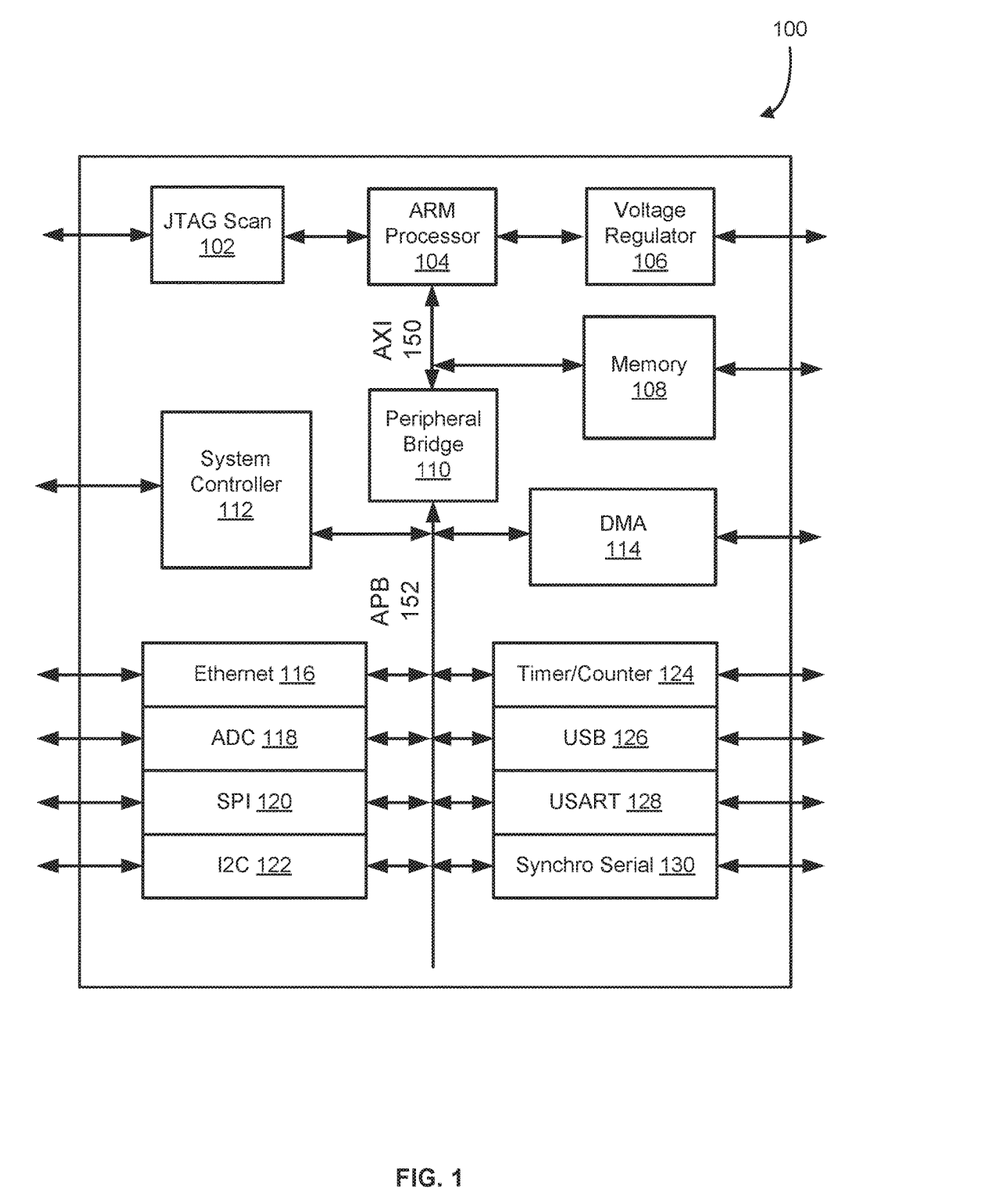
FIG. 1 illustrates a schematic block diagram of an example of an SoC.

An SoC typically includes many functional units, also sometimes referred to as Intellectual Property (IP) blocks. FIG. 1 illustrates a schematic block diagram of an example of an SoC 100. The SoC 100 includes a processor 104, a JTAG scan block 102 coupled to the processor 104, and a voltage regulator 106 as a DC voltage source for the SoC 100. The SoC 100 also includes a system controller 112, a memory block 108, and a Direct Memory Access (DMA) engine 114. The SoC 100 further includes a number of peripherals and external interfaces, such as an Ethernet interface 116, an analog-to-digital converter (ADC) 118, a Serial Peripheral Interface (SPI) 120, an Inter-Integrated Circuit (I2C) interface 122, a timer/counter 124, a Universal Serial Bus (USB) interface 126, a Universal Synchronous/Asynchronous Receiver/Transmitter (USART) interface 128, and a synchronous serial interface 130. The processor 104 may comprise, for example, an ARM or ARM-based processor. The processor 104 communicates with the other functional units on the SoC through a bus, such as the ARM Advanced Microcontroller Bus Architecture (AMBA) bus. A peripheral bridge 110 may be used to change from a high bandwidth bus, such as an Advanced eXtensible Interface (AXI) 150, to a low bandwidth bus, such as an Advanced Peripheral Bus (APB) 152. Some SoCs may have multiple processor cores.

Each functional unit on an SoC has either automatically generated register files or proprietary hand-made register spaces. All register files and register spaces require mapping and configuration access by the chip software in order to enable the software's operation. As different functional units get added, dropped, or relocated during various phases of a design cycle, repeated updates to the complete configuration space are usually required. This process can be error-prone, time consuming and often requires the involvement of the entire design team.

Techniques described herein include a modular configuration scheme. According to an embodiment, the configuration scheme uses a master module to route all configuration access requests to various functional units through a set of adapter modules. The master module has an upstream interface coupled to a host unit for receiving a write burst or a read burst. The master module converts the write burst or the read burst into a series of access requests to a downstream interface. The upstream interface may use a high bandwidth bus, such as an AXI bus. The downstream interface may use a low bandwidth bus, such as an APB bus. According to some embodiments, the master module performs error-reporting and error-recovery. The master module may use a round robin arbitration scheme between read and write. The basic algorithm of a round robin arbitration scheme implies that once a requestor has been served it would "go around" to the end of the line and be the last to be served again. In an embodiment, the master module uses a read/write weighted round robin arbitration scheme with priority for read over write, for example four reads per one write. In addition, the master module is optionally equipped with a hang-protection mechanism upon detecting a non-response for any access request within a predetermined time-out period.

Each adapter module includes an input interface, an output interface, and an endpoint interface. According to some embodiments, the downstream interface of the master module is coupled to the input interface of the first adapter module. The set of adapter modules are interconnected to each other as a "tree-branch" network. A branch or chain is formed by coupling the output interface of an adapter module to the input interface of the next adapter module. The endpoint interface of an adapter module may be coupled to a functional unit for providing access space for that functional unit, or be coupled to another adapter module to form a new branch. The endpoint interface of each adapter module may include a corresponding bus protocol converter for a respective functional unit or a respective branch of the network.

According to an embodiment, if a new functional unit needs to be added to the SoC during a design cycle, the configuration space for the new functional unit is created by inserting a new adapter module in a desired location in the tree-branch network, and coupling the new adapter module to the new functional unit through its endpoint interface. In such a case, the new adapter module is configured to claim transactions belonging to certain address ranges. In one implementation, an address Base Address Register (BAR) is assigned and configured in the adapter module to claim transactions belonging to a certain address range. The new adapter module is configured to detect a local access request corresponding to its assigned address BAR.

Similarly, if an existing functional unit needs to be moved from one location to another location in the tree-branch network, the adapter module for that functional unit may be disconnected from its original chain and be inserted into another chain in a desired location in the tree-branch network. The original chain is stitched together by coupling the output interface and the input interface of the neighboring adapter modules. The adapter module corresponding to that functional unit may retain the same address BAR after the relocation. Thus, under this modular approach, the rearrangement of the functional units would not affect the configuration space. This allows a team of designers to dynamically modify the SoC structure without repeatedly updating the complete configuration space.

Figure 2:
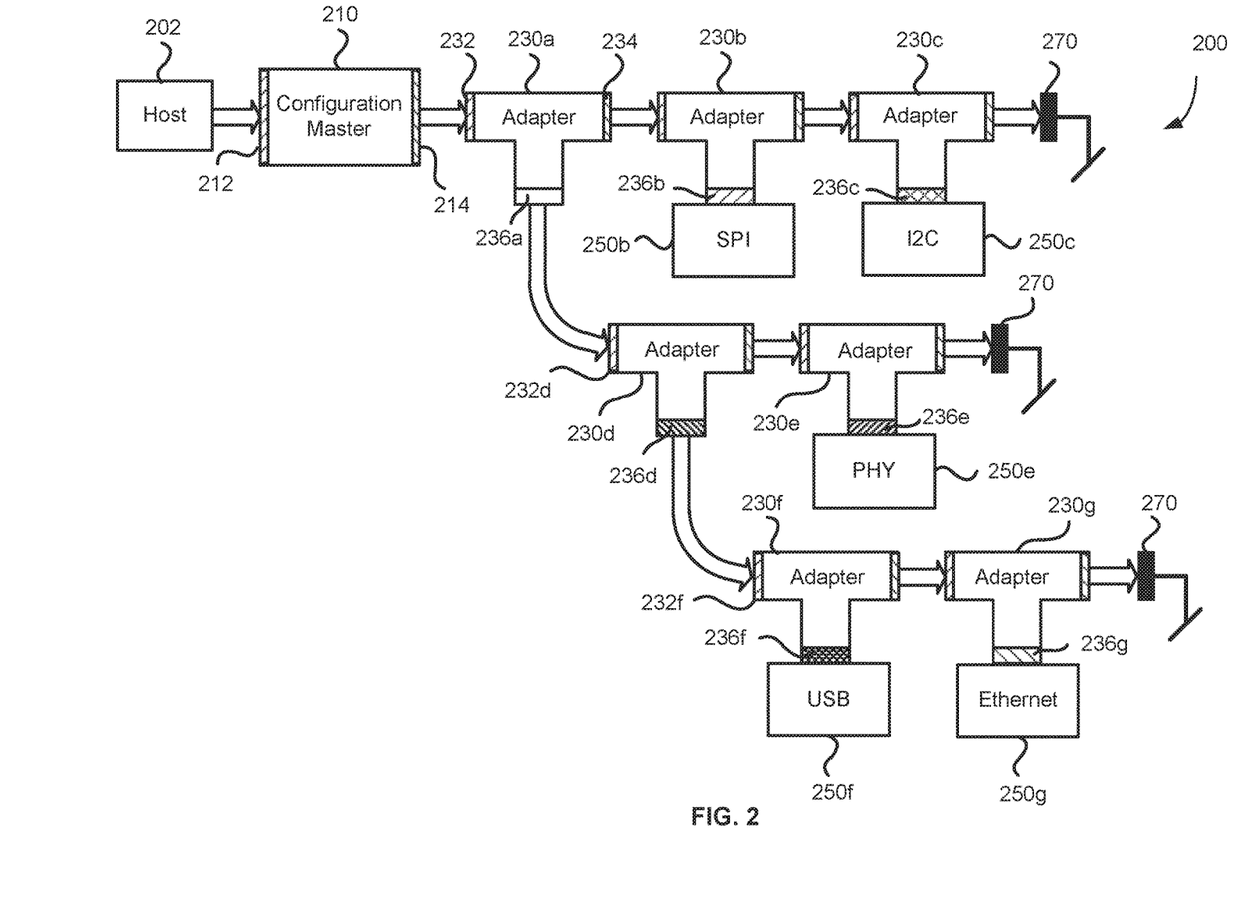
FIG. 2 illustrates a schematic block diagram of a configuration system for an SoC according to an embodiment.

FIG. 2 shows a schematic block diagram of a configuration system 200 according to an embodiment. The configuration system 200 includes a configuration master 210 and a plurality of adapter modules 230. The configuration master 210 includes an upstream interface 212 and a downstream interface 214. The upstream interface 212 is coupled to a host unit 202 of an SoC through an internal high bandwidth bus system. The configuration master 210 is configured to accept one read burst or one write burst from the host unit 202 through the upstream interface 212, and to convert the read burst or the write bursts into a series of single access requests to the downstream interface 214. The master module and each adapter module may be implemented as an electronic circuit or a combination of an electronic circuit and software. In addition, the configuration system 200 may be implemented as an integrated circuit.

Each adapter module 230 includes an input interface 232, an output interface 234, and an endpoint interface 236. According to an embodiment, the plurality of adapter modules 230 are interconnected to each other as a tree-branch network. The input interface 232 of a first adapter module 230a is coupled to the downstream interface 214 of the configuration master 210. Two or more adapter modules 230 may be interconnected to each other as a chain by coupling the input interface 232 of one adapter module 230 to the output interface 234 of the next adapter module 230. For example, in the embodiment illustrated in FIG. 2, the adapter modules 230a, 230b, and 230c are interconnected to each other as a chain to form a first branch of the tree-branch network; the adapter modules 230d and 230e are interconnected to each other as chain to form a second branch; and the adapter modules 230f and 230g are interconnected to each other as a chain to form a third branch. A branch may comprise any number of adapter modules 230 forming a long chain or a short chain according various embodiments. A chain may be terminated by coupling the output interface 234 of the last adapter module 230 in the chain to a termination module 270. It should be noted that the phrase "coupled" used herein refers to directly or indirectly "coupled." Similarly, the phrase "coupling" used herein refers to directly or indirectly "coupling."

Each adapter module 230 may be configured to claim a certain address range. In one embodiment, the adapter includes an address BAR and an access detection circuitry configured to detect a local access request corresponding to the address BAR. The endpoint interface 236 of an adapter module 230 may be coupled to a respective functional unit of the SoC for providing configuration access to the respective functional unit. For example, in FIG. 2, the adapter module 230b is coupled to an SPI interface 250b; the adapter module 230c is coupled to an I2C interface 250c; the adapter module 230e is coupled to a physical layer device (PHY) 250e; the adapter module 230f is coupled to a USB port 250f; and the adapter module 250g is coupled to an Ethernet port 250g. These are only a few non-limiting examples of the functional units that might be coupled to the endpoint interface 236 of an adapter module 230. The endpoint interface 236 of an adapter module 230 may be coupled to other types of functional units, such as a memory block, a timer/counter, a DMA engine, an asynchronous domain engine, and the like.

The endpoint interface 236 of an adapter module 230 may also be coupled to the input interface 232 of another adapter module 230 to form a new branch of the tree-branch network. For example, in FIG. 2, the endpoint interface 236a of the adapter module 230a is coupled to the input interface 232d of the adapter module 230d to form a second branch; and the endpoint interface 236d of the adapter module 230d is coupled to the input interface 232f of the adapter module 230f to form a third branch. This may be used for forming a sub-address-BAR within a detected address BAR. Various tree-branch topologies are possible according to various embodiments. For example, a sub branch may be formed from the endpoint interface 236 of an adapter module 230 in the middle of a branch.

A transaction received at the input interface 232 of an adapter module may be claimed by the endpoint interface 236 or may propagate on to a following adaptor module 230 coupled to the endpoint interface 236, using address BAR decoding including protection permissions if applicable. According to an embodiment, the interface protocols at the output interface 234 and at the endpoint interface 236 are the same, so branches can expand from both the output interface 234 and the endpoint interface 236. While all transactions at the output interface 234 propagate to later adapter modules 230 in the branches expanding from the output interface 234, only the transactions corresponding to the address BAR claimed by the endpoint interface 236 propagate to later adapter modules 230 in the branches expanding from the endpoint interface 236, enabling the respective branches to be localized to within the corresponding address BAR.

Figure 3:
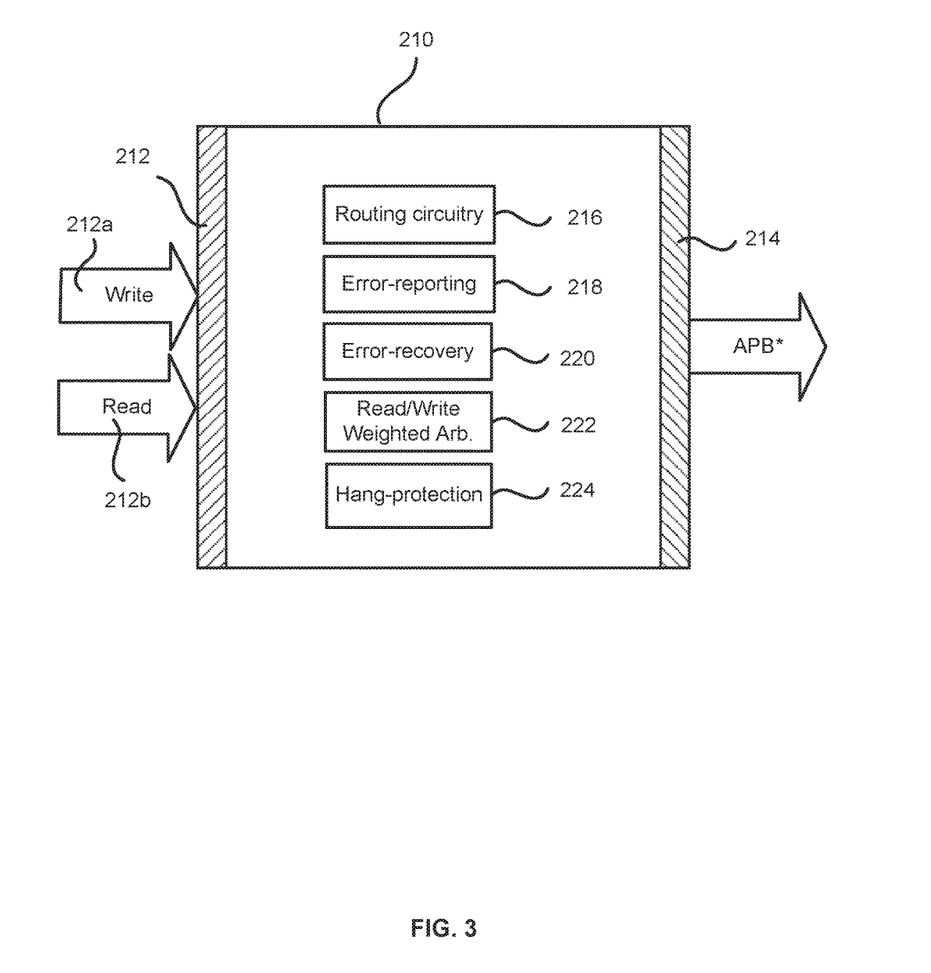
FIG. 3 illustrates a schematic block diagram of a master module of the configuration system according to an embodiment.

FIG. 3 illustrates a schematic block diagram of a configuration master 210 according to an embodiment. The upstream interface 212 of the configuration master 210 comprises a write channel 212a and a read channel 212b, configured to receive a write burst or a read burst, respectively, from a host unit 202. The incoming transactions may be any kind of burst, such as incremental burst, wrapping burst, and the like. A routing circuitry 216 converts the read burst or the write burst received from the host unit 202 into a series of access requests to be routed through the downstream interface 214.

In an embodiment, the upstream interface 212 uses a high bandwidth bus such as a 32-bits AXI bus. The downstream interface 214 uses a low bandwidth bus such as an APB bus, or an APB bus with regret mode. According to some embodiments, the upstream interface 212 and the downstream interface 214 may comprise any one of the bus protocols defined by the AMBA 5 specification such as the Coherent Hub Interface (CHI), or by the AMBA 4 specification such as the AXI Coherency Extensions (ACE), the Advanced Extensible Interface 4 (AXI4), the Advanced Extensible Interface 4 Lite (AXI4-Lite), Advanced Extensible Interface 4 Stream (AXI4-Stream v1.0), the Advanced Trace Bus (ATB v1.1), and the Advanced Peripheral Bus (APB4 v2.0), or by the AMBA 3 specification such as the Advanced Extensible Interface (AXI3 or AXI v1.0), the Advanced High-Performance Bus Lite (AHB-Lite v1.0), the Advanced Peripheral Bus (APB3 v1.0), and the Advanced Trace Bus (ATB v1.0), or by the AMBA 2 specification such as the Advanced High-Performance Bus (AHB), the Advanced System Bus (ASB), the Advanced Peripheral Bus (APB2 or APB), or by the AMBA specification (first version) such as the Advanced System Bus (ASB) and the Advanced Peripheral Bus (APB). According to other embodiments, the upstream interface 212 and the downstream interface 214 may comprise other bus protocols such as the OpenCores Wishbone bus, the IBM CoreConnect bus, the IDT IPBus, the Altera Avalon bus, the Open Core Protocol (OCP), the AMD Hyper Transport, the Intel Quick Path, and the like.

According to an embodiment, the configuration master 210 includes an error-reporting circuitry 218 and an error-recovery circuitry 220 for error-reporting and error-recovery, respectively, upon encountering a configuration error and/or protocol violation error. The configuration master 210 also includes a circuitry 222 for performing read/write weighted round robin (WRR) arbitration. According to an embodiment, the WRR arbitration favors reads with configurable read-number limit per single write, such as four reads per write, if both are pending.

The configuration master 210 may also include a hang-protection mechanism 224. According to an embodiment, the downstream interface 214 comprises an APB bus with regret mode (denoted by the "*" after "APB" in FIG. 3). Upon detecting a non-response for any access request within a predetermined time-out period, the hang-protection mechanism 224 sends out a "flush" wave over the APB by forcing deassertion of PSEL and PENABLE (valid transaction signals) of the APB protocol, and resetting the transaction tracker to its initial state waiting for a new transaction start soon after.

Below is an excerpt of example Verilog code for the interfaces of the configuration master 210, according to an embodiment.

```
module ap_cfgbus_master #(parameters . . . )
(
  input clk,
  input reset_n,
  ace_if_axi3.rd_slave axi_rd,
  ace_if_axi3.wr_slave axi_wr,
  apb4_cfg_if.master apb_chain_out,
//
  input cfg_clr_apb_fsm, // emergency cleanup . . .
  input cfg_ignore_wid, // in case AXI4 in mind . . .
  input [AXI_TIMER_WIDTH-1:0] cfg_timeout_limit,
  input cfg_wfifo_clear,
  input [WRR_CNT_WIDTH-1:0] cfg_wrr_cnt,
// Functional Configs . . .
  input cfg_rd_slv_err_en,
  input cfg_rd_dec_err_en,
  input cfg_wr_slv_err_en,
  input cfg_wr_dec_err_en
);
```

Figure 4:
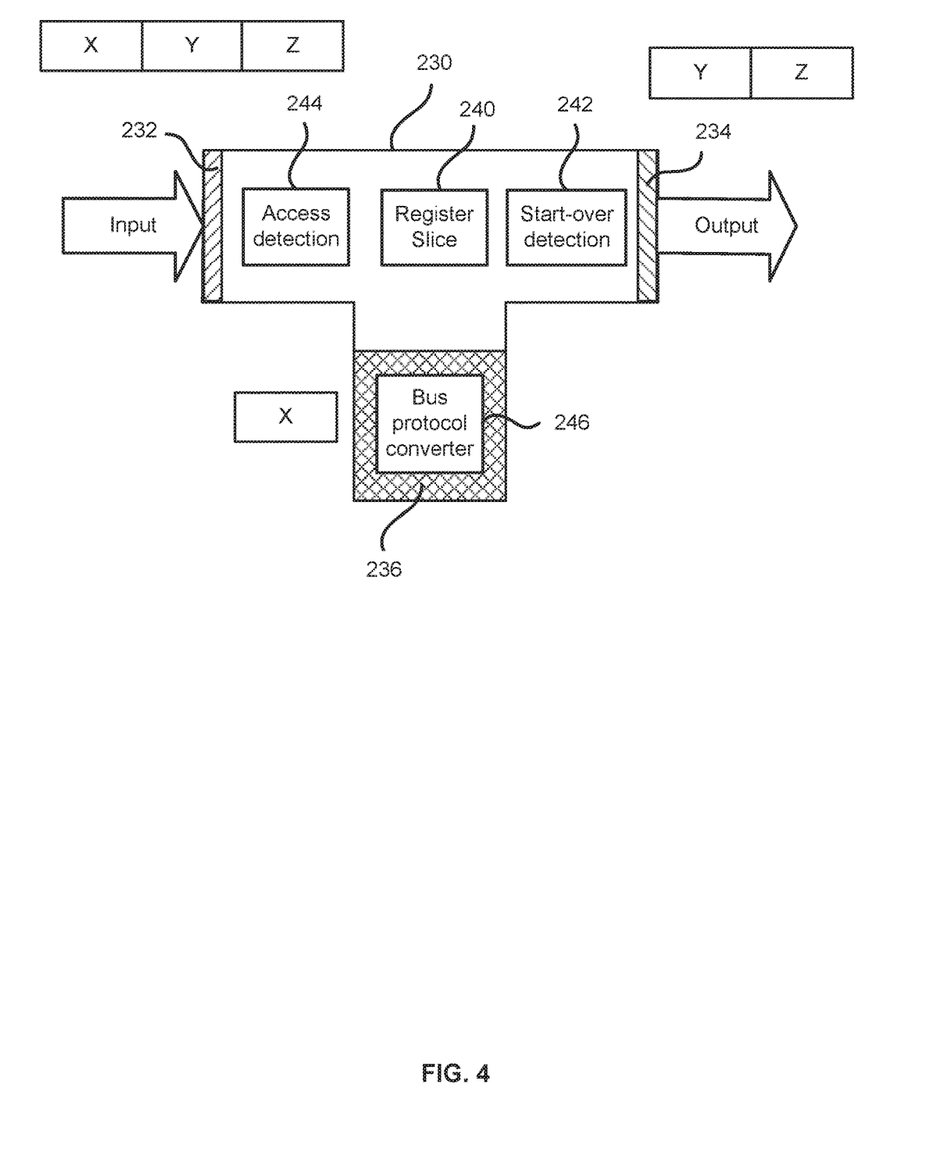
FIG. 4 illustrates a schematic block diagram of an adapter module of the configuration system according to an embodiment.

FIG. 4 illustrates a schematic block diagram of an adapter module 230 according to an embodiment. The adapter module 230 includes an access detection circuitry 244 for detecting a local access based on the corresponding address BAR configured for the adapter module 230. When a local access is detected, the endpoint interface 236 of the adapter module 230 claims the corresponding transaction (for example the "X" transaction) received from the input interface 232. The rest of the transactions (for example the "Y" and the "Z" transactions) received from the input interface 232 passes through to the output interface 234 of the adapter module 230. According to an embodiment, the endpoint interface 236 and the output interface 234 have similar structures. Thus, a new branch or sub-branch of the tree-branch network may be started at the endpoint interface 236 or the output interface 234.

According to an embodiment, the endpoint interface 232 of the adapter module 230 includes a bus protocol converter 246 for converting a first bus protocol to a second bus protocol appropriate for a particular type of functional unit or branch. For example, the second bus protocol may be one of an AXI bus protocol, an APB bus protocol, a proprietary bus protocol, a register file interface, a physical layer interface (PHY) interface, a proprietary IP interface protocols, an asynchronous agent, or a rise-to-fall handshake agent (i.e., a slow speed hold-violation-prevention agent), and the like.

According to an embodiment, the adapter module 230 includes a "start-over" detection circuitry 242 configured to detect a "flush" wave sent out by the configuration master 210 signaling a bail-out and start-over upon detecting a non-response for any access request within a predetermined time-out period, as described above in relation to FIG. 3. For example, in FIG. 4, if an APB PSEL deassertion is detected, the adapter module 230 propagates this signal to all adapter modules 230 downstream, and locally terminates the accesses on its endpoint interface 236. The adapter module can further return to an idle state and wait for a new APB access to initiate, as signaled by a new PSEL assertion, along with transaction attributes.

According to some embodiments, the adapter module 230 further includes staging capability for timing closure at the backend stage. The maximum clock frequency of a synchronous clock domain is set by its critical path. The longest path of combinational logic must have settled before the setup time of any flip-flop starts. Meeting timing closure is the process of manipulating a design to meet its target clock rate. Staging (often called pipelining) is a commonly-used technique to boost system performance. Introducing a pipeline stage (for example, implemented using a register slice) in a bus increases latency, but it also increases the maximum clock frequency. Register slices may be instanced using a parametric call, independent for each direction: the request path from the input interface 232 to the output interface 234, the request path from the input interface 232 to the endpoint interface 236, the response path returning from the output interface 234 to the input interface 232, or the response path from the endpoint interface 236 to the input interface 232. This way, potential timing issues can be prevented in advance, on account of additional clock cycle delay in each path. Each adapter module 230 may be modified to include one or more register slices 240 later at the implementation stage if physical timing reports indicate the need for a timing breakpoint.

Below is an excerpt of example Verilog code for the interfaces of an adapter module 230 with an APB endpoint protocol, according to an embodiment.

```
module ap_cfgbus_ep_apb #( . . . parameters . . . )
(
   output [2:0] address_type,
   output address_valid,
   input address_hit,
//
   apb4_cfg_if.slave apb_chain_in,
   apb4_cfg_if.master apb_chain_out,
   apb4_cfg_if.master apb_ep,
//
   input clk,
   input reset_n
);
```

According to an embodiment, the configuration scheme may include a termination module 270 configured to claim all unclaimed address spaces to prevent a hang from occurring. Alternatively, the configuration scheme may include filler modules to fill the uncovered address spaces.

The modular configuration scheme disclosed herein affords easy instancing, since each adapter module 230 has a low number of ports (namely three APB ports: input, output, and endpoint, referred to as "chain-in," "chain-out," and "ep," respectively, in the Verilog code excerpts shown herein). Below are excerpts of example Verilog code for instancing a series of adapter modules, according to some embodiments.

```
ap_cfgbus_ep_apb #(
   .PADDR_WIDTH(PADDR_WIDTH), .PDATA_WIDTH
(PDATA_WIDTH), .PUSER_WIDTH(PUSER_WIDTH),
   .APB_LOCAL_STAGING(APB_LOCAL_STAGING_
FRST),
   .APB_RSP_STAGING(APB_RSP_STAGING_FRST),
   .APB_REQ_STAGING(APB_REQ_STAGING_FRST))
ap_pbs_cfg_ep_frst
  (
   .apb_chain_in (apb_chain_in),
   .apb_chain_out (apb_chain_0),
   .apb_ep (apb_ep_frst),
//
   .address_type (addr_type_frst),
   .address_valid (addr_valid_frst),
   .address_hit (addr_hit_frst),
//
   .clk (clk),
   .reset_n (reset_n));
//-----------------------------
ap_cfgbus_ep_apb #(
   .PADDR_WIDTH(PADDR_WIDTH), .PDATA_WIDTH
(PDATA_WIDTH), .PUSER_WIDTH(PUSER_WIDTH),
   .APB_LOCAL_STAGING(APB_LOCAL_STAGING_
SCND),
   .APB_RSP_STAGING(APB_RSP_STAGING_SCND),
   .APB_REQ_STAGING(APB_REQ_STAGING_SCND))
ap_pbs_cfg_ep_scnd
  (
   .apb_chain_in (apb_chain_0),
   .apb_chain_out (apb_chain_1),
   .apb_ep (apb_ep_scnd),
//
   .address_type (addr_type_scnd),
   .address_valid (addr_valid_scnd),
   .address_hit (addr_hit_scnd),
//
   .clk (clk),
   .reset_n (reset_n));
//-----------------------------
```

According to an embodiment, the output interface 234 of the last adapter module 230 in each chain is coupled to a termination module 270, eliminating the need for explicit assignment of each one of the bus members in the output interface 234. A termination module aids in closing the downstream interface, including assertion of the response associated signals to non-active (e.g., PRDATA, PREADY, and PSLVERR), filling the need of not leaving the response path undriven. Below is an excerpt of example Verilog code for the interfaces of a termination module configured for an APB4 bus, according to an embodiment.

```
module ap_cfgbus_ep_terminate #(parameter PDATA_
width=32)
(
apb4_cfg_if.slave apb_chain_in);
```

The modular configuration scheme disclosed herein affords a simplified configuration process in a design cycle when a new functional unit is added or an existing functional unit needs to be relocated on the SoC. For example, if a new functional unit needs to be inserted between two adjacent existing functional units, the additional configuration space for the new functional unit is created by inserting an additional adapter module between the adapter modules that are coupled to the two existing functional units, and coupling the endpoint interface of the additional adapter module to the new functional unit. An address range is assigned to the adapter module by configuring the address BAR for the additional adapter module enabling it to claim a corresponding local access request.

Similarly, if an existing functional unit needs to be relocated in the tree-branch network, the adapter module for that functional unit may be disconnected from its original chain and be inserted into another chain in a desired location in the tree-branch network. The original chain is stitched together by coupling the output interface and the input interface of the neighboring adapter modules. The adapter module corresponding to that functional unit may continue to claim the same address range, despite the relocation of the functional unit. Thus, the rearrangement of the functional unit would not affect the configuration space. The software running on the processors can always assume that the particular functional unit will have the same assigned address space, regardless of the change of its location in the tree-branch network. This modular approach allows a team of designers to dynamically modify the SoC structure without repeatedly updating the complete configuration space. It also affords compatibility over several generations of an SoC design.

Figure 5:
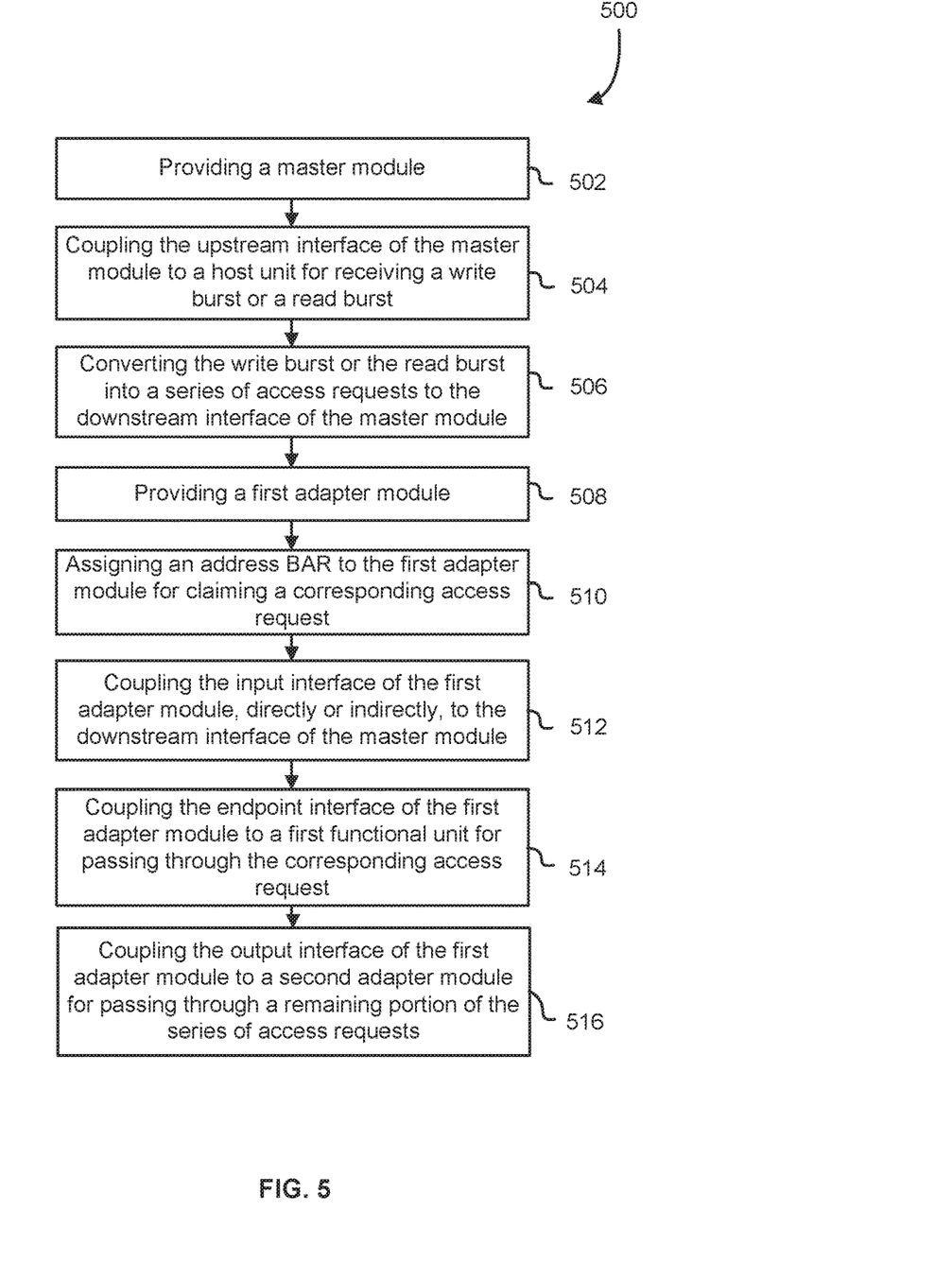
FIG. 5 illustrates a flowchart for a method of configuring an SoC according to an embodiment.

FIG. 5 illustrates a flowchart for a method of configuring an SoC according to an embodiment. The method includes, at step 502, providing a master module 210. The master module 210 includes an upstream interface 212 and a downstream interface 214. The method includes, at step 504, coupling the upstream interface 212 of the master module 210 to a host unit 202 of the SoC for receiving a write burst or a read burst. The method includes, at step 506, converting the write burst or the read burst into a series of access requests to the downstream interface 214 of the master module 210. The method further includes, at step 508, providing a first adapter module 230. The first adapter module 230 includes an input interface 232, an output interface 234, and an endpoint interface 236. The method includes, at step 510, assigning an address BAR to the first adapter module 230 for claiming a corresponding access request among the series of access requests, and at step 512, coupling the input interface 232 of the first adapter module 230 to the downstream interface 214 of the master module 210. The method includes, at step 514, coupling the endpoint interface 236 of the first adapter module 230 to a first functional unit for passing the corresponding access request thereto, and at step 516, coupling the output interface 234 of the first adapter module 230 to a second adapter module 230 for passing through a remaining portion of the series of access requests, or to a termination module 270.

It should be appreciated that the specific steps illustrated in FIG. 5 provide a particular method of configuring an SoC according to an embodiment. Other sequences of steps may also be performed according to alternative embodiments. For example, alternative embodiments may perform the steps outlined above in a different order. Moreover, the individual steps illustrated in FIG. 5 may include multiple sub-steps that may be performed in various sequences as appropriate to the individual step. Furthermore, additional steps may be added or removed. One of ordinary skill in the art would recognize many variations, modifications, and alternatives.

Figure 6:
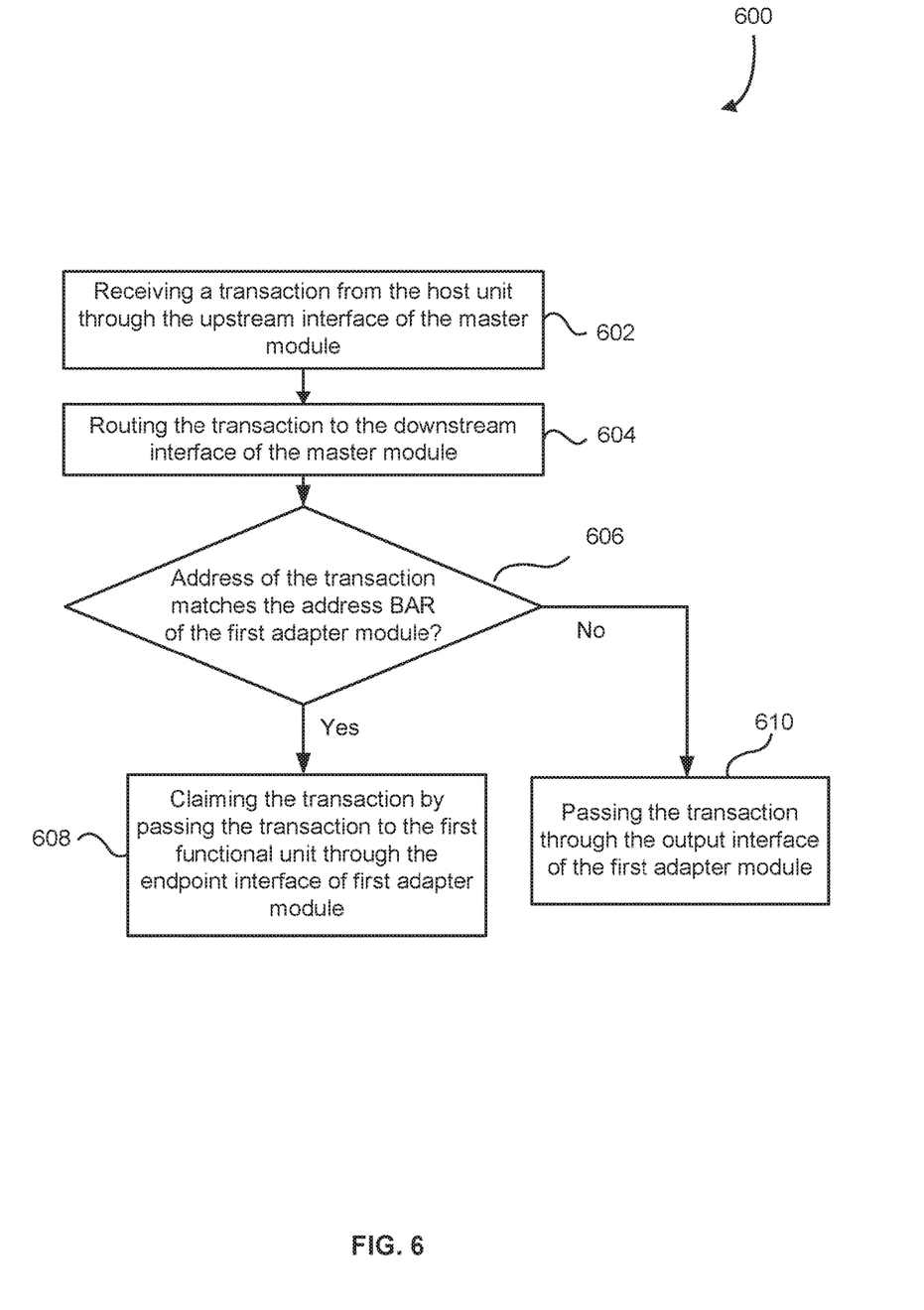
FIG. 6 illustrates a flowchart for a method of operating an SoC according to an embodiment.

FIG. 6 illustrates a flowchart for a method of operating an SoC according to an embodiment. The SoC includes a host unit 202 and a first functional unit. The SoC also includes a master module 210 and a first adapter module 230. The master module 210 includes an upstream interface 212 and a downstream interface 214. The first adapter module 230 includes an input interface 232, an output interface 234, and an endpoint interface 236. The upstream interface 212 of the master module 210 is coupled to the host unit 202. The input interface 232 of the first adapter module 230 is coupled to the downstream interface 214 of the master module 210. The endpoint interface 234 of the first adapter module 230 is coupled to the first functional unit. The method includes, at step 602, receiving a transaction from the host unit 202 through the upstream interface 212 of the master module 210, and at step 604, routing the transaction to the downstream interface 214 of the master module 210. The method also includes, at step 606, comparing the address of the transaction to the address BAR of the first adapter module 230. If the address of the transaction matches the address BAR of the first adapter module 230, the method includes, at step 608, claiming the transaction by passing the transaction to the first functional unit through adapter module 230. If the address of the transaction does not match the address BAR of the first adapter module 230, the method includes, at step 610, passing the transaction through the output interface 234 of the first adapter module 230.

It should be appreciated that the specific steps illustrated in FIG. 6 provide a particular method of operating an SoC according to an embodiment. Other sequences of steps may also be performed according to alternative embodiments. For example, alternative embodiments may perform the steps outlined above in a different order. Moreover, the individual steps illustrated in FIG. 6 may include multiple sub-steps that may be performed in various sequences as appropriate to the individual step. Furthermore, additional steps may be added or removed. One of ordinary skill in the art would recognize many variations, modifications, and alternatives.

Some or all of the processes 500 and 600 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Figure 7:
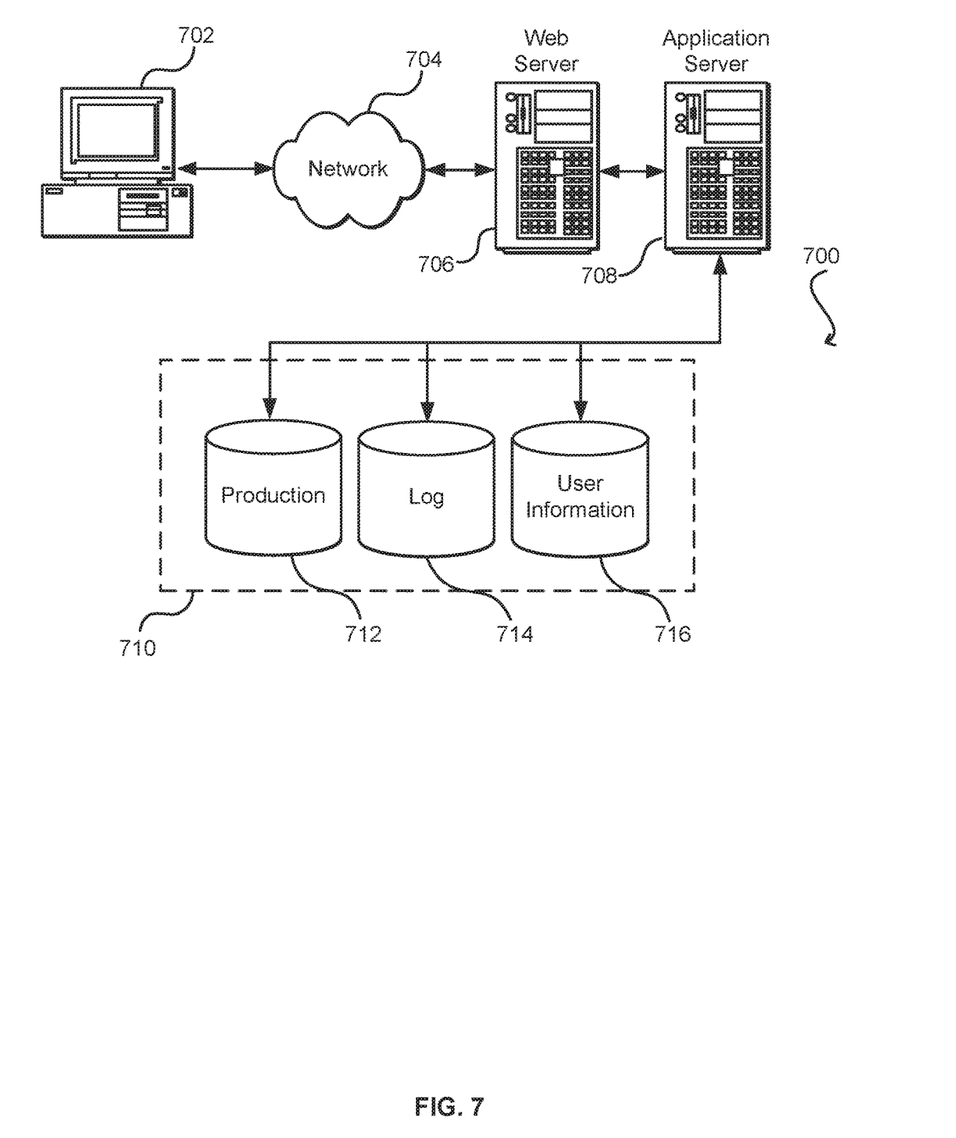
FIG. 7 illustrates an environment in which various embodiments can be implemented.

FIG. 7 illustrates aspects of an example environment 600 for implementing aspects in accordance with various embodiments. As will be appreciated, although a Web-based environment is used for purposes of explanation, different environments may be used, as appropriate, to implement various embodiments. The environment includes an electronic client device 702, which can include any appropriate device operable to send and receive requests, messages, or information over an appropriate network 704 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 706 for receiving requests and serving content in response thereto, although for other networks an alternative device serving a similar purpose could be used as would be apparent to one of ordinary skill in the art.

The illustrative environment includes at least one application server 708 and a data store 710. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. The handling of all requests and responses, as well as the delivery of content between the client device 702 and the application server 708, can be handled by the Web server. It should be understood that the Web and application servers are not required and are merely example components, as structured code discussed herein can be executed on any appropriate device or host machine as discussed elsewhere herein.

The data store 710 can include several separate data tables, databases or other data storage mechanisms and media for storing data relating to a particular aspect. For example, the data store illustrated includes mechanisms for storing production data 712 and user information 716, which can be used to serve content for the production side. The data store also is shown to include a mechanism for storing log data 714, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 710. The data store 710 is operable, through logic associated therewith, to receive instructions from the application server 708 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 702. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 7. Thus, the depiction of the system 700 in FIG. 7 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. An integrated circuit device, comprising:
a plurality of functional units, wherein each functional unit includes a set of configuration registers;
a plurality of adapter modules, each adapter module having a plurality of interfaces including a first interface, a second interface, and a third interface, wherein the first interface is configured to receive configuration transactions, and wherein the second interface and the third interface are each configured to transmit configuration transactions;
a bus network, wherein the bus network includes the plurality of functional units and the plurality of adapter modules, wherein the functional units are each coupled to a second interface of an adapter module from the plurality of adapter modules, wherein the second interface of an adapter module from the plurality of adapter modules is configured with an address range corresponding to an address range of one or more of the functional units, wherein each adapter module is configured to use the third interface of the adapter module to transmit all configuration transactions that include an address that is outside of an address range configured for the second interface; and
a configuration master module configured to receive configuration transactions for configuring the plurality of functional units, wherein, upon receiving a configuration transaction, the configuration master module transmits the configuration transaction to the bus network, wherein, when a particular adapter module from the plurality of adapter modules receives the configuration transaction at a first interface of the particular adapter module, the particular adapter module determines whether an address associated with the configuration transaction is within a particular address range associated with a second interface of the particular adapter module, wherein the particular adapter module transmits the configuration transaction using the second interface of the particular adapter module when the address is within the particular address range, and wherein the particular adapter module transmits the configuration transaction using a third interface of the particular adapter module when the address is not within the particular address range.

2. The integrated circuit device of claim 1, wherein a first set of adapter modules from the plurality of adapter modules is arranged in a chain, wherein, in the chain, a third interface of each adapter module from the first set of adapter modules is connected to a first interface of another adapter module from the first set of adapter modules.

3. The integrated circuit device of claim 2, wherein the chain includes a last adapter module, wherein a third interface of the last adapter module is connected to a terminator module, and wherein the terminator module is configured to accept any configuration transaction.

4. The integrated circuit device of claim 2, wherein the chain includes a last adapter module, wherein a second interface of the last adapter module is connected to a filler module, wherein the filler module is a functional unit configured with one or more address ranges that are not used by a functional unit connected to the first set of adapter modules.

5. The integrated circuit device of claim 1, wherein a first adapter module from plurality of adapter modules is arranged to form a branch, wherein at the branch, a third interface of the first adapter module is connected to the first interface of a second adapter module, and wherein the second interface of the first adapter module is connected to the first interface of a third adapter module.

6. The integrated circuit device of claim 5, wherein a first address range configured for the second interface of the first adapter module includes one or more address ranges for a one or more functional units from the plurality of functional units.

7. The integrated circuit device of claim 1, wherein the configuration master module is configured to:
determine that a time-out period has ended; and
upon determining that no response was received for the configuration transaction before the time-out period ended, transmit a signal to the bus network to reset the bus network.

8. The integrated circuit device of claim 1, wherein the plurality of functional units include a microprocessor, a memory block, a timing source, a peripheral device, or an external interface.

9. The integrated circuit device of claim 1, wherein each configuration register in a set of configuration registers is associated with an address, and wherein each functional unit is associated with an address range, the address range including each address associated with a set of configuration registers of the functional unit.

10. The integrated circuit device of claim 1, wherein a configuration register controls an operation of a respective functional unit.

11. An integrated circuit device, comprising:
a first functional unit and a second functional unit each including a respective set of configuration registers;
a configuration master module configured to receive configuration transactions for configuring the first functional unit and the second functional unit; and
a first adapter module, a second adapter module, and a third adapter module each having a plurality of interfaces including a first interface, a second interface, and a third interface, wherein the first interface is configured to receive configuration transactions, wherein the second interface and the third interface are each configured to transmit configuration transactions, and wherein:
the configuration master module is coupled to a first interface of the first adapter module, wherein, when the configuration master module receives a configuration transaction, the configuration master module transmits the configuration transaction to the first interface of the first adapter module;
a third interface of the first adapter module is coupled to a first interface of the second adapter module;
a third interface of the second adapter module is coupled to a first terminator module;
a second interface of the second adapter module is coupled to the first functional unit, wherein the second interface is configured with an address range associated with the first functional unit;
a second interface of the first adapter module is coupled to a first interface of the third adapter module, wherein the second interface is configured with an address range associated with the second functional unit;
a third interface of the third adapter module is coupled to a second terminator module; and
a second interface of the third adapter module is coupled to the second functional unit, wherein the second interface is configured with the address range associated with the second functional unit.

12. The integrated circuit device of claim 11, wherein, when an address associated with the configuration transaction is within the address range configured for the second interface of the first adapter module, the first adapter module transmits the configuration transaction using the second interface of the first adapter module, and wherein, when the address is not within an address range configured for the second interface of the first adapter module, the first adapter module transmits the configuration transaction using the third interface of the first adapter module.

13. The integrated circuit device of claim 11, wherein, when an address associated with the configuration transaction is within the address range configured for the second interface of the second adapter module, the second adapter module transmits the configuration transaction using the second interface of the second adapter module, and wherein, when the address is not within the address range configured for the second interface of the second adapter module, the second adapter module transmits the configuration transaction using the third interface of the second adapter module.

14. The integrated circuit device of claim 11, wherein, when an address associated with the configuration transaction is within the address range configured for the second interface of the third adapter module, the third adapter module transmits the configuration transaction using the second interface of the third adapter module, and wherein, when the address is not within the address range configured for the second interface of the third adapter module, the third adapter module transmits the configuration transaction using the third interface of the third adapter module.

15. The integrated circuit device of claim 11, further comprising:
one or more additional adapter modules coupled between the first adapter module and the second adapter module, wherein an additional functional unit is coupled to an adapter module from the one or more additional adapter modules.

16. The integrated circuit device of claim 11, further comprising:
one or more additional adapter modules coupled between the first adapter module and the third adapter module, wherein a second interface of each of the one or more additional adapter modules is configured with the address range associated with the second functional unit.

17. The integrated circuit device of claim 11, further comprising:
one or more additional adapter modules coupled between the third adapter module and the second terminator module, wherein an additional functional unit is coupled to an adapter module from the one or more additional adapter modules.

18. A computer-implemented method, comprising:
upon receiving a configuration transaction, transmitting, by a configuration master module of an integrated circuit device, the configuration transaction to a bus network including a plurality of functional units, wherein each functional unit includes a set of configuration registers, and wherein the configuration transaction is for configuring a configuration register of a particular functional unit from the plurality of functional units;
receiving, by a particular adapter module from a plurality of adapter modules in the bus network, the configuration transaction, wherein the particular adapter module receives the configuration transaction at a first interface from a plurality of interfaces of the particular adapter module, wherein the plurality of adapter modules each include a first interface, a second interface, and a third interface, wherein the plurality of functional units are each coupled to a second interface of an adapter module from the plurality of adapter modules;
determining, by the particular adapter module, to transmit the configuration transaction using a second interface of the particular adapter module when an address associated with the configuration transaction is within an address range associated with the second interface of the particular adapter module, wherein the address range corresponds to an address range associated with one or more of the plurality of functional units; and
determining, by the particular adapter module, to transmit the configuration transaction using the third interface of the particular adapter module when the address is not within the address range.

19. The computer-implemented method of claim 18, further comprising:
translating a first bus protocol to a second bus protocol, wherein the first bus protocol is implemented by each of the first interface the second interface, and the third interface, wherein the second bus protocol is implemented by a functional unit, wherein a translated configuration transaction is directed to the second interface.

20. The computer-implemented method of claim 18, wherein the first interface and the third interface implement a same bus protocol, and wherein the bus protocol enables the third interface to be connected to a first interface of another adapter module.

21. The computer-implemented method of claim 18, wherein the first interface and the second interface implement a same bus protocol, wherein the bus protocol enables the second interface to be connected to a first interface of another adapter module.

* * * * *